United States Patent
Distaso et al.

(10) Patent No.: US 8,461,556 B2
(45) Date of Patent: Jun. 11, 2013

(54) USING BEAM BLOCKERS TO PERFORM A PATTERNED IMPLANT OF A WORKPIECE

(75) Inventors: Daniel Distaso, Merrimac, MA (US); Russell J. Low, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 260 days.

(21) Appl. No.: 12/877,666

(22) Filed: Sep. 8, 2010

(65) Prior Publication Data

US 2012/0056110 A1   Mar. 8, 2012

(51) Int. Cl.
*G21K 5/10* (2006.01)

(52) U.S. Cl.
USPC ............... 250/492.22; 250/492.1; 250/492.2; 250/492.21; 250/492.3

(58) Field of Classification Search
USPC ............................................ 250/492.1–492.3
See application file for complete search history.

(56) References Cited

U.S. PATENT DOCUMENTS

| | | | |
|---|---|---|---|
| 5,126,575 A * | 6/1992 | White | 250/492.3 |
| 5,350,926 A | 9/1994 | White et al. | |
| 7,767,986 B2 | 8/2010 | Dorai et al. | |
| 2008/0099067 A1 | 5/2008 | Ito et al. | |
| 2009/0317937 A1 | 12/2009 | Gupta et al. | |
| 2010/0124799 A1 | 5/2010 | Blake et al. | |
| 2011/0089342 A1 | 4/2011 | Daniels et al. | |
| 2011/0089343 A1 * | 4/2011 | Daniels et al. | 250/492.21 |
| 2011/0092059 A1 | 4/2011 | Daniels et al. | |
| 2011/0155929 A1 * | 6/2011 | Bassom et al. | 250/492.21 |
| 2011/0192993 A1 | 8/2011 | Chun et al. | |

FOREIGN PATENT DOCUMENTS

| | | | |
|---|---|---|---|
| JP | 2003249189 A | 9/2003 | |
| JP | 2007163640 A | 6/2007 | |

OTHER PUBLICATIONS

Takeshi Shibata, et al., Stencil Mask Ion Implantation Technology for Sub 100-nm Technology Node, Extended Abstracts of International Workshop on Junction Technology 2001, Nov. 29, 2001, pp. 11-14, Japan Society of Applied Physics.

* cited by examiner

*Primary Examiner* — Michael Maskell

(57) ABSTRACT

Blockers in an ion beam blocker unit selectively block or trim an ion beam. In one instance, the ion beam has first current regions and second current regions. These current regions may be unequal. The ion beam is then implanted into a workpiece to form regions with different doses. The workpiece may be scanned so that the entirety of its surface is implanted.

17 Claims, 5 Drawing Sheets

USING BEAM BLOCKERS TO PERFORM A PATTERNED IMPLANT OF A WORKPIECE

FIELD

This invention relates to patterned implantation and, more particularly, to patterned implantation using beam blockers.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

In one instance, a ribbon ion beam is used to implant the workpiece. A ribbon ion beam cross-section has a long dimension and a short dimension. The long dimension, for example, may be referred to as a width or x-direction, though other orientations are possible. The ribbon ion beam may be formed using a parallelizing lens or may be a scanned spot beam.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

There are many different solar cell architectures. Two common designs are the selective emitter (SE) and the interdigitated backside contact (IBC). A SE solar cell has high-dose stripes across the lightly doped surface impinged by sunlight. An IBC solar cell has alternating p-type and n-type stripes across the surface not impinged by sunlight. Both a SE and IBC solar cell may be implanted to dope the various regions.

Solar cells or other workpieces may need to be implanted such that different regions receive different doses. In most instances, this requires multiple implantation steps. For SE solar cells, one implant is typically a blanket implant across the entirety of the solar cell and the second implant is typically a selective implant into particular regions that need a heavier dose. The selective implant may use, for example, photoresist or a stencil mask. Use of two implants adds processing costs, increases production time, and may increase the number of implanters required in a manufacturing facility. Furthermore, lithography is costly and time-consuming and stencil masks may be difficult to properly align. Therefore, there is a need in the art for patterned implantation and, more particularly, patterned implantation where different doses are implanted simultaneously.

SUMMARY

According to a first aspect of the invention, a method of implantation is provided. The method comprises generating an ion beam having a long dimension. A portion of the ion beam is blocked at a plurality of locations across the long dimension. The ion beam is simultaneously implanted into a workpiece at a first dose and a second dose after the blocking. The first dose corresponds to the plurality of locations and the second dose is higher than the first dose.

According to a second aspect of the invention, a method of implantation is provided. The method comprises generating an ion beam having a long dimension. A portion of the ion beam is blocked at a plurality of locations across the long dimension. The ion beam is simultaneously implanted into a workpiece after the blocking to form a first plurality of regions having a first dose and a second plurality of regions having a second dose greater than the first dose. The first plurality of regions correspond to the plurality of the locations of the blocking.

According to a third aspect of the invention, a method of implantation is provided. The method comprises generating an ion beam having a long dimension. A portion of the ion beam is blocked at a plurality of locations across the long dimension. The amount of blocking is individually controlled for the plurality of locations. The workpiece is scanned with respect to the ion beam. A patterned implant of the workpiece is performed. A first dose is implanted at a plurality of regions corresponding to the plurality of locations of the blocking. A second dose higher than the first dose is implanted into a remainder of the workpiece.

According to a fourth aspect of the invention, a method of implantation is provided. The method comprises generating an ion beam having a long dimension. A portion of the ion beam is blocked at a plurality of locations across the long dimension to form a patterned ion beam having first current regions and second current regions across the long dimension. The first current regions have a lower current than the second current regions and correspond to the plurality of locations. Both the first current regions and the second current regions have a current greater than zero. The workpiece is scanned with respect to the patterned ion beam. The workpiece is implanted with the patterned ion beam such that the workpiece is simultaneously implanted with the first current regions and the second current regions.

BRIEF DESCRIPTION OF THE DRAWINGS

For a better understanding of the present disclosure, reference is made to the accompanying drawings, which are incorporated herein by reference and in which.

DETAILED DESCRIPTION

These apparatus and method embodiments are described herein in connection with an ion implanter. However, the various embodiments can be used with other systems and processes involved in semiconductor manufacturing or other systems that use charged particles. While a solar cell is specifically mentioned, other workpieces such as semiconductor wafers, light-emitting diodes (LEDs), flat panels, or other workpieces known to those skilled in the art also may benefit. Furthermore, while a ribbon beam is disclosed, the embodiments disclosed herein also may be applicable to a spot beam or a scanned spot beam. Thus, the invention is not limited to the specific embodiments described below.

Figure 1:
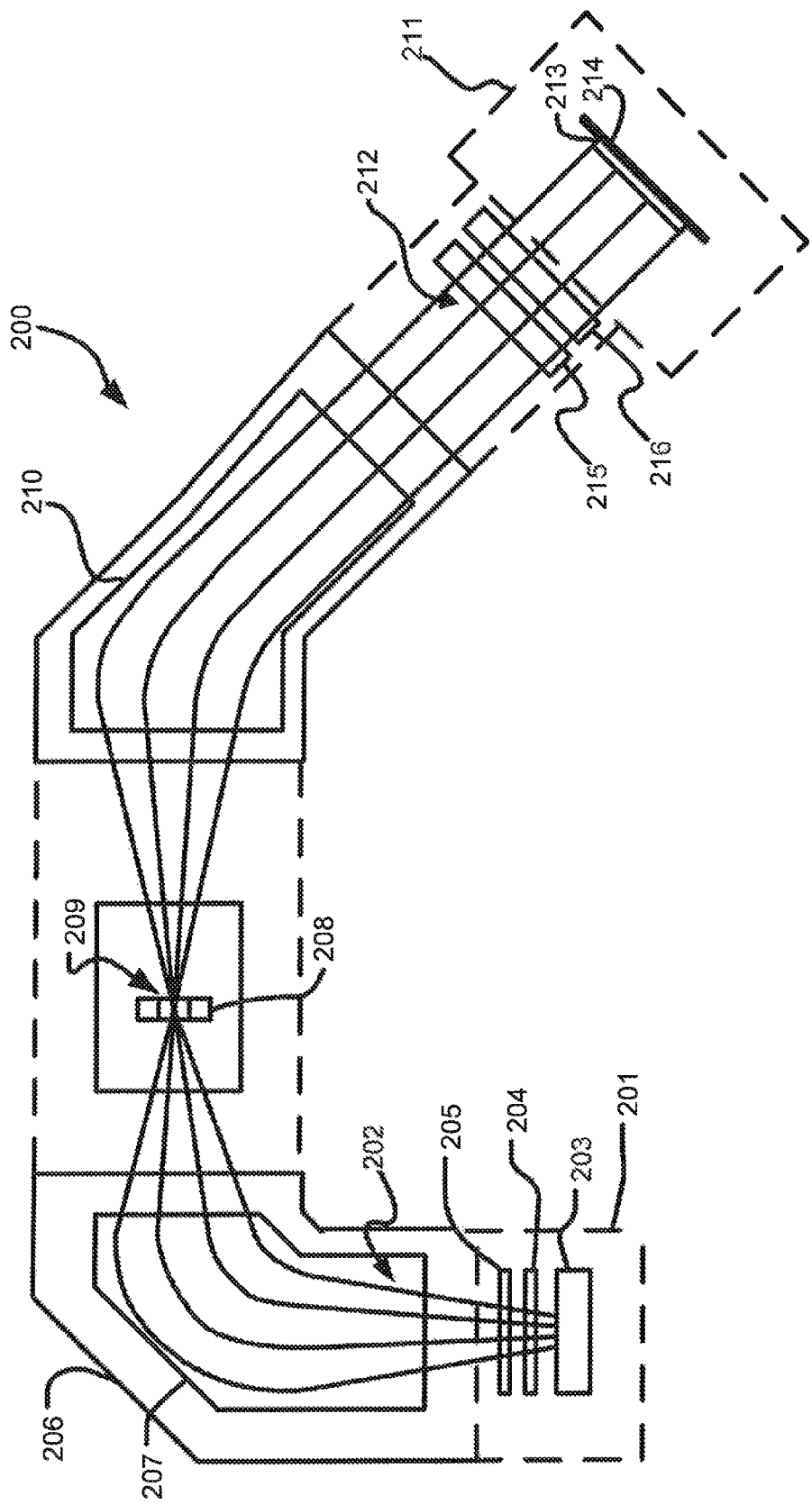
FIG. 1 is a block diagram of a beam-line ion implanter.

FIG. 1 is a block diagram of a beam-line ion implanter 200. Those skilled in the art will recognize that the beam-line ion implanter 200 is only one of many examples of beam-line ion implanters that can produce ions. Thus, the embodiments disclosed herein are not limited solely to the beam-line ion implanter 200 of FIG. 1.

In general, the beam-line ion implanter 200 includes an ion source 201 to generate ions that form an ion beam 202. The ion source 201 may include an ion chamber 203. A gas is supplied to the ion chamber 203 where the gas is ionized. This gas may be or may include or contain, in some embodiments, a p-type dopant, an n-type dopant, carbon, hydrogen, a noble gas, a molecular compound, or some other species known to those skilled in. the art. The ions thus generated are extracted from the ion chamber 203 to form the ion beam 202. The ion beam 202 passes through a suppression electrode 204 and ground electrode 205 to the mass analyzer 206. The mass analyzer 206 includes a resolving magnet 207 and a masking electrode 208 having a resolving aperture 209. The resolving magnet 207 deflects ions in the ion beam 202 such that ions of a desired ion species pass through the resolving aperture 209. Undesired ion species do not pass through the resolving aperture 209, but are blocked by the masking electrode 208.

Ions of the desired ion species pass through the resolving aperture 209 to the angle corrector magnet 210. The angle corrector magnet 210 deflects ions of the desired ion species and converts the ion beam from a diverging ion beam to ribbon ion beam 212, which has substantially parallel ion trajectories. The beam-line ion implanter 200 may further include an ion beam energy adjustment unit 215. This ion beam energy adjustment unit 215 may be, for example, an acceleration lens or deceleration lens that changes the energy of the ion beam from a first energy to a second energy. An ion beam blocker unit 216 blocks a portion of the ribbon ion beam 212 and is positioned upstream of the end station 211 or platen 214.

An end station 211 supports one or more workpieces, such as workpiece 213, in the path of ribbon ion beam 212 such that ions of the desired species are implanted into workpiece 213. The workpiece 213 may be, for example, a solar cell. The end station 211 may include a platen 214 to support one or more workpieces 213. The end station 211 also may include a scanner (not shown) for moving the workpiece 213 perpendicular to the long dimension of the ribbon ion beam 212 cross-section, thereby distributing ions over the entire surface of workpiece 213. It will be understood to those skilled in the art that the entire path traversed by the ion beam is evacuated during ion implantation. The ion implanter 200 may include additional components known to those skilled in the art and may incorporate hot or cold implantation of ions in some embodiments.

Figure 2:
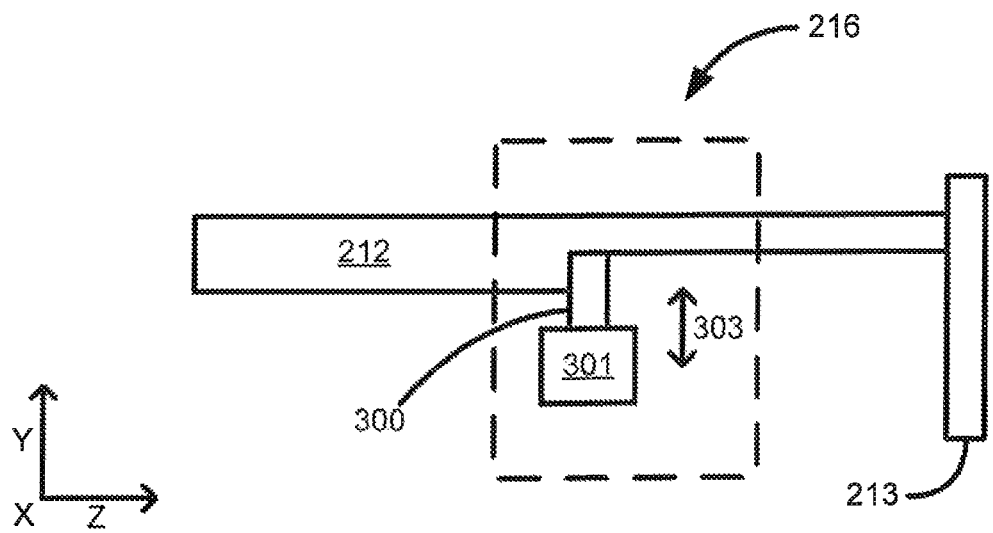
FIG. 2 is a side cross-sectional view of an ion beam blocker unit.

FIG. 2 is a side cross-sectional view of an ion beam blocker unit. The ion beam blocker unit 216 (shown by the dotted line) is in the path of the ribbon ion beam 212 as it travels in the z-direction to implant the workpiece 213. The ion beam blocker unit 216 includes at least one blocker 300. Each blocker 300 is connected to a drive unit 301 to translate the blocker 300 in the y-direction illustrated by arrow 303. The distance the blocker 300 is translated affects how much of the ribbon ion beam 212 is blocked or trimmed. The drive unit 301 may be a piezo-electric drive or some other system known to those skilled in the art. The blocker 300 may be fabricated of graphite or some other material that does not contaminate the ribbon ion beam 212.

Figure 3:
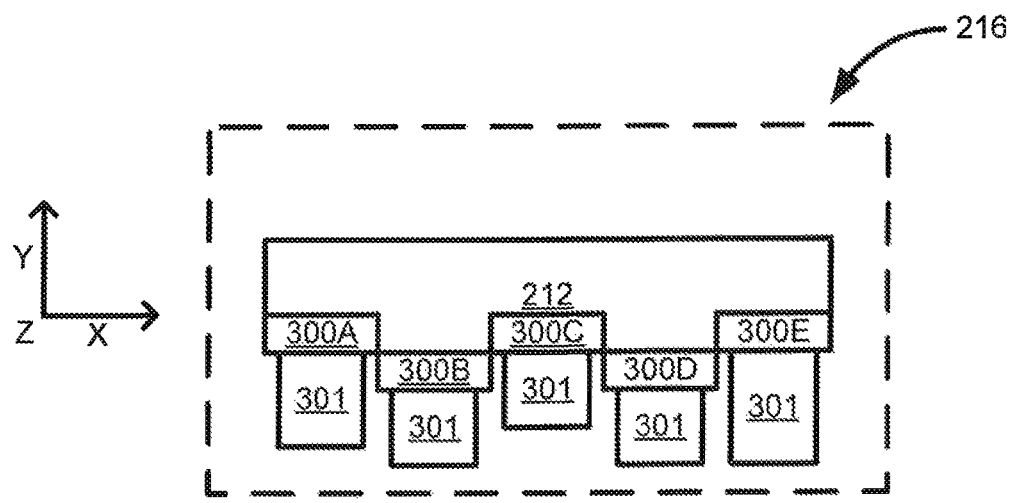
FIG. 3 is a front perspective view of the ion beam blocker unit illustrated in FIG. 2.

FIG. 3 is a front perspective view of the ion beam blocker unit illustrated in FIG. 2. FIG. 3 still illustrates the ribbon ion beam 212 going in the z-direction, but now the z-direction comes out of the page. Five blockers 300A-E are illustrated in FIG. 3, but other configurations also may be used and this embodiment is not solely limited to five. The blockers 300A-E may be arranged in an array, which may block the ribbon ion beam 212 at multiple locations. The drive units 301 translate the blockers 300A-E in the y-direction. Each blocker 300A-E may be individually translated. Thus, blockers 300A, 300C, 300E block or trim more of the ribbon ion beam than blockers 300B, 300D. The individual pattern of the blockers 300A-E depends on the desired patterned implant, the non-uniformity of the ribbon ion beam 212, or how much of the ribbon ion beam 212 needs to be blocked or trimmed. The blockers 300A-E also may be translated out of the path of the ribbon ion beam 212. A controller may be used to determine the placement or translation of the individual blockers 300A-E. This controller may be connected to a measurement device that can detect uniformity, profile, or current of the ribbon ion beam 212.

Figure 4:
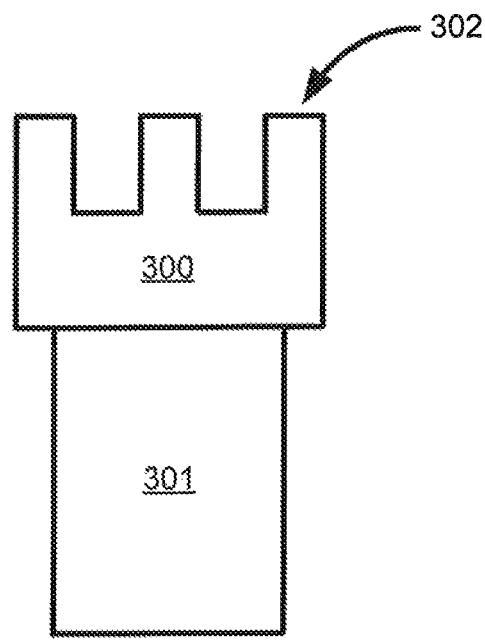
FIG. 4 is a front perspective view of a second embodiment of a blocker.

While rectangular blockers 300A-E are illustrated, other shapes are possible. For example, each blocker 300A-E may have multiple crenellations or teeth that can block or trim the ribbon ion beam 212. Other patterns or shapes also may be used. FIG. 4 is a front perspective view of a second embodiment of a blocker. The blocker 300 includes multiple teeth 302. Thus, each blocker 300 can block multiple portions of the ion beam.

Figure 5:
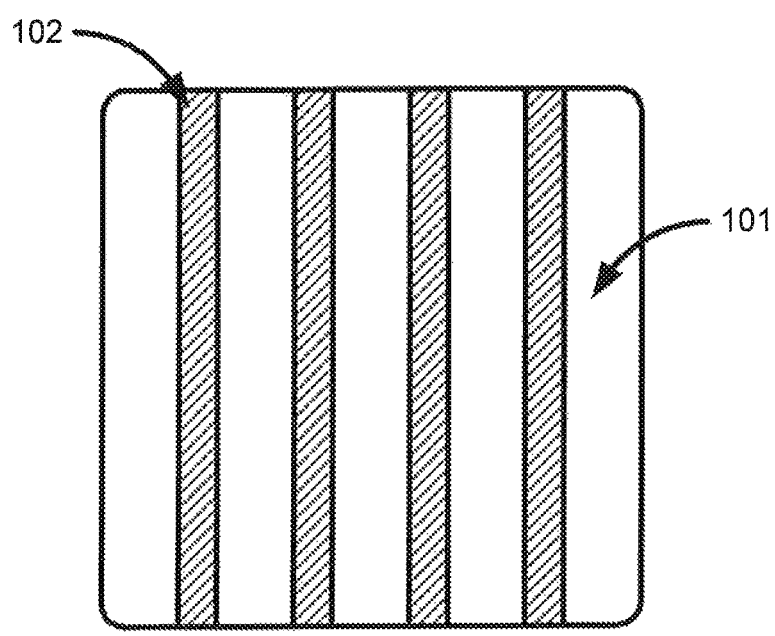
FIG. 5 is a front perspective view of an implanted solar cell.

FIG. 5 is a front perspective view of an implanted solar cell. The solar cell 100 is one example of a SE solar cell with first dose regions 101 and second dose regions 102. The second dose regions 102 have a higher dose than the first dose regions 101. Conductive contacts, which may be metal, may be applied to the second dose regions 102 to form the solar cell 100. The embodiments disclosed herein allow simultaneous doping of both the first dose regions 101 and second dose regions 102 without multiple implant steps.

Figure 6:
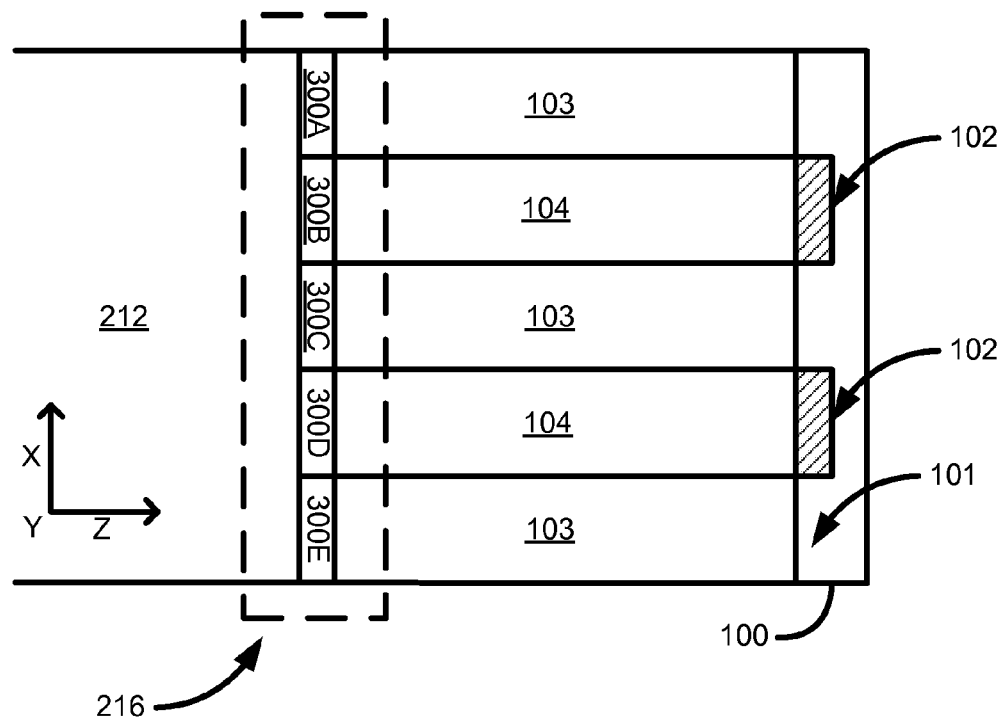
FIG. 6 is a top perspective view of implantation of a solar cell using the ion beam blocker unit illustrated in FIG. 3.

FIG. 6 is a top perspective view of implantation of a solar cell using the ion beam blocker unit illustrated in FIG. 3. The blockers 300A-E in the ion beam blocker unit 216 correspond to those illustrated in FIG. 3. Thus, blockers 300A, 300C, 300E block or trim more of the ribbon ion beam than blockers 300B, 300D due to placement in the y-direction. The ribbon ion beam 212 downstream of the blockers 300A-E is divided into first current regions 103 and second current regions 104 across the long dimension or x-direction of the ribbon ion beam 212. The first current regions 103 are blocked more by the blockers 300A-E than the second current regions 104 and, consequently, have a lower beam current. This enables the second current regions 104 with the higher beam current to form the second dose regions 102 (shown by the diagonal lines) in the solar cell 100. Therefore, the first dose regions 101 of the solar cell 100 correspond to the location of the blockers 300A-E that are configured to block or trim more of the ribbon ion beam 212 and form the first current regions 103. The solar cell 100 may be scanned in the y-direction to implant the entirety of its surface.

In one particular embodiment, the second dose regions 102 have a dose that is three times greater than the dose of the first dose regions 101. The blockers 300A-E that selectively form the first current regions 103 block two-thirds of the ribbon ion beam 212 in one embodiment. In another particular embodiment, neither the first current regions 103 nor second current regions 104 have zero current. Both the first current regions 103 and second current regions 104 have some current in this embodiment. Thus, the first dose regions 101 and second dose regions 102 may have doses greater than zero.

Figure 7:
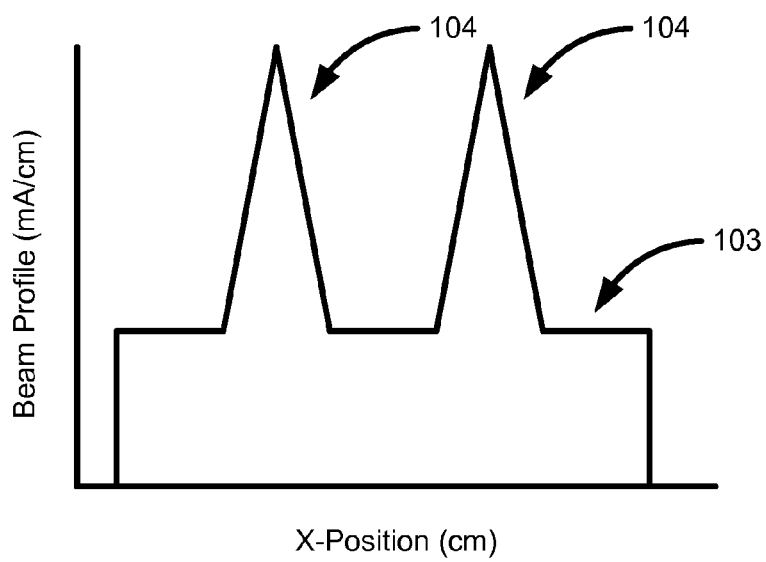
FIG. 7 is a graph showing beam profile versus x-position for the embodiment illustrated in FIG. 6.

FIG. 7 is a graph showing beam profile versus x-position for the embodiment illustrated in FIG. 6. FIG. 6 illustrated first current regions 103 and second current regions 104, which also are illustrated in the graph shown in FIG. 7. The blockers 300A, 300C, and 300E reduce the beam current to form the first current regions 103 of the ribbon ion beam.

Figure 8:
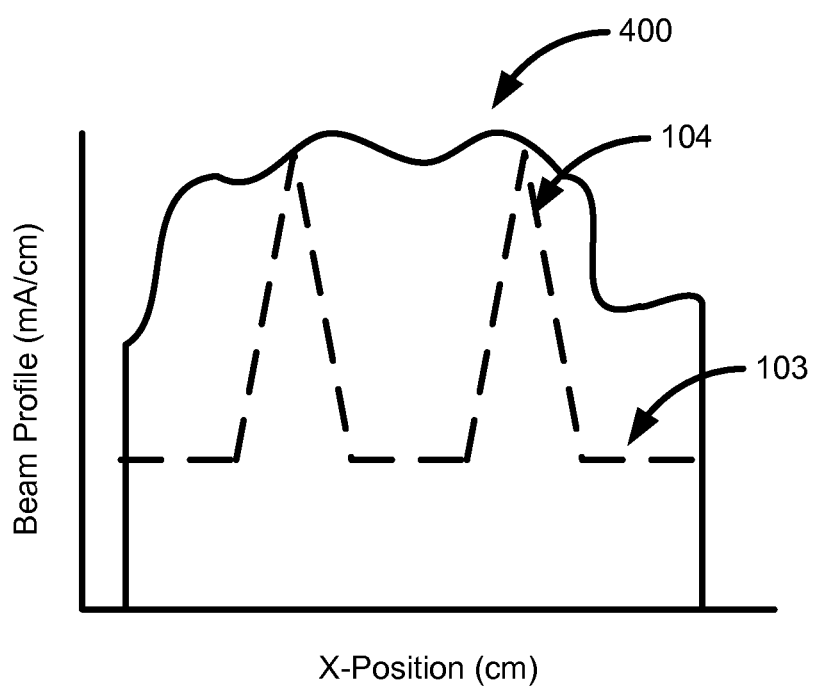
FIG. 8 is a graph showing beam profile versus x-position for a non-uniform beam.

FIG. 8 is a graph showing beam profile versus x-position for a non-uniform beam. The beam profile 400 in the ribbon on beam may be imperfect or non-uniform. While such a beam profile might otherwise affect the implant of the solar cell or other workpiece, the blockers 300A-E illustrated in FIG. 3 may be used to sculpt or correct the beam. As illustrated in FIG. 8 by the dotted line, the beam profile 400 may be blocked or trimmed to form first current regions 103 and second current regions 104. Thus, what might otherwise be a beam that would result in imprecise doping of the solar cell or other workpiece, can still be used for implantation. For some beam profiles, the blockers may be individually-controlled and may form a unique array unlike the sawtooth array illustrated in FIG. 3 to compensate. Individual placement may be used if the beam profile is particularly non-uniform.

The blockers also may compensate for expansion of the ribbon ion beam. The charged particles that form the ribbon ion beam are one cause of this expansion or "blow up." The blockers in the ion beam blocker unit may be placed proximate to the workpiece or solar cell to reduce expansion of the ribbon beam. The blockers also may be positioned to block or trim a portion of the ribbon ion beam calculated to compensate for any expansion between the ion beam blocker unit and the workpiece. Furthermore, when part of a ribbon ion beam, for example, impacts or strikes a blocker, secondary electrons may be created with the blocker material. These secondary electrons can assist in neutralizing the ribbon ion beam. As the ribbon ion beam becomes more neutralized, less "blow up" will occur as the ribbon ion beam continues downstream.

One particular benefit is that the blockers in the ion beam blocker unit are dynamic. A single implanter may be used for multiple implant species, ribbon ion beam configurations, different implant patterns, or different workpieces. The blockers may be adjusted as these various parameters change, which reduces equipment costs. Another benefit is that the ion beam blocker unit may ensure a uniform implant of the workpiece. The blockers may be individually adjusted so that the various regions being implanted on the workpiece are uniform. This is an improvement over, for example, a stencil mask or photoresist because these methods cannot adjust the ion beam or compensate for non-uniformities in the ion beam. While a stencil mask or photoresist may selectively implant, the beam being implanted may be non-uniform.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of ion implantation comprising:
generating an ion beam having a long dimension;
adjusting placement of a plurality of blockers based on beam current across said ion beam;
blocking a portion of said ion beam with said blockers at a plurality of locations across said long dimension, wherein said blocking is individually controlled at said plurality of locations; and
simultaneously implanting said ion beam across a dimension of a workpiece at a first dose and a second dose after said blocking, wherein said first dose corresponds to said plurality of locations and said second dose is higher than said first dose and wherein said first dose and said second dose are both greater than zero.

2. The method of claim 1, wherein said ion beam has a non-uniform beam current, said adjusting is based on said non-uniform beam current, and said blocking is configured to implant said first dose and said second dose uniformly across said workpiece.

3. The method of claim 1, further comprising scanning said workpiece with respect to said ion beam.

4. The method of claim 1, wherein said blocking is configured to compensate for expansion of said ion beam.

5. The method of claim 1, further comprising applying conductive contacts to a plurality of regions implanted with said second dose.

6. The method of claim 2, further comprising scanning said workpiece with respect to said ion beam.

7. The method of claim 2, wherein said blocking is configured to compensate for expansion of said ion beam.

8. The method of claim 2, further comprising applying conductive contacts to said second plurality of regions.

9. A method of ion implantation comprising:
generating an ion beam having a long dimension, wherein said ion beam has a non-uniform beam current;
blocking a portion of said ion beam at a plurality of locations across said long dimension, wherein an amount of said blocking is individually controlled for said plurality of locations and is configured to correct for said non-uniform beam current and simultaneously implant a first dose and a second dose uniformly across a dimension of a workpiece;
scanning said workpiece with respect to said ion beam; and
performing a patterned implant of said workpiece, wherein said first dose is implanted at a plurality of regions corresponding to said plurality of locations of said blocking and said second dose higher than said first dose is implanted into a remainder of said workpiece, and wherein said first dose and said second dose are both greater than zero.

10. The method of claim 9, wherein said blocking is configured to compensate for expansion of said ion beam.

11. The method of claim 9, further comprising applying conductive contacts to a plurality of regions having said second dose.

12. A method of ion implantation comprising:
generating an ion beam having a long dimension;
blocking a portion of said ion beam at a plurality of locations across said long dimension using a plurality of blockers configured to be independently translated in a direction perpendicular to said long dimension to form a patterned ion beam having first current regions and second current regions across said long dimension, said first current regions having a lower current than said second current regions and corresponding to said plurality of locations, wherein both said first current regions and said second current regions have a current greater than zero, and wherein said portion that is blocked is unequal at two of said plurality of locations;

scanning a workpiece with respect to said patterned ion beam; and implanting said workpiece with said patterned ion beam such that said workpiece is simultaneously implanted with said first current regions and said second current regions across a dimension of said workpiece.

13. The method of claim 1, further comprising forming a first plurality of regions having said first dose and a second plurality of regions having said second dose that is greater than said first dose, said first plurality of regions corresponding to said plurality of said locations of said blocking.

14. The method of claim 1, wherein said dimension is a width of said workpiece and further comprising scanning said workpiece in a perpendicular direction with respect to said width.

15. The method of claim 9, wherein said dimension is a width of said workpiece and wherein said scanning is in a direction perpendicular to said dimension.

16. The method of claim 12, wherein said dimension is a width of said workpiece and wherein said scanning is in a direction perpendicular to said dimension.

17. The method of claim 1, wherein said adjusting further comprises translating one of said plurality of blockers with respect to another of said plurality of blockers.

* * * * *